(12) United States Patent
Kim et al.

(10) Patent No.: US 11,785,805 B2
(45) Date of Patent: Oct. 10, 2023

(54) DISPLAY DEVICE WITH PIXEL CIRCUIT HAVING A PLURALITY OF TRANSISTORS

(71) Applicant: Samsung Display Co., Ltd., Yongin-si (KR)

(72) Inventors: Keun Woo Kim, Seongnam-si (KR); Tae Wook Kang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 17/246,367

(22) Filed: Apr. 30, 2021

(65) Prior Publication Data

US 2021/0376025 A1    Dec. 2, 2021

(30) Foreign Application Priority Data

Jun. 2, 2020    (KR) .................... 10-2020-0066455

(51) Int. Cl.
| | |
|---|---|
| G09G 3/3233 | (2016.01) |
| H10K 59/121 | (2023.01) |
| G09G 3/3291 | (2016.01) |
| G09G 3/3258 | (2016.01) |
| H10K 59/131 | (2023.01) |

(52) U.S. Cl.
CPC ....... H10K 59/1213 (2023.02); G09G 3/3233 (2013.01); G09G 3/3258 (2013.01); G09G 3/3291 (2013.01); H10K 59/1216 (2023.02); H10K 59/131 (2023.02)

(58) Field of Classification Search
CPC ........... G09G 3/3208–3291; G09G 3/30–3291
See application file for complete search history.

(56) References Cited

U.S. PATENT DOCUMENTS

| | | | |
|---|---|---|---|
| 10,482,817 B2 | 11/2019 | Kim et al. | |
| 10,885,843 B1 * | 1/2021 | Lu | ......................... G09G 3/3266 |
| 2002/0043991 A1 * | 4/2002 | Nishitoba | ............ G09G 3/3233 |
| | | | 327/94 |
| 2004/0207615 A1 * | 10/2004 | Yumoto | ................. G09G 3/325 |
| | | | 345/211 |

(Continued)

FOREIGN PATENT DOCUMENTS

| | | |
|---|---|---|
| CN | 108154846 A | 6/2018 |
| CN | 113363290 A | 9/2021 |
| KR | 10-2021-0113513 A | 9/2021 |

*Primary Examiner* — Roberto W Flores
(74) *Attorney, Agent, or Firm* — Lewis Roca Rothgerber Christie LLP

(57) ABSTRACT

A display device includes: a plurality of pixels on a substrate, each of the plurality of pixels including a light emitting element and a pixel circuit configured to drive the light emitting element, wherein the pixel circuit of each of the plurality of pixels comprises: a first-first transistor configured to control a driving current flowing through the light emitting element based on a voltage of a first node; a first-second transistor connected in series with the first-first transistor and configured to control the driving current based on a voltage of a second node; a second transistor configured to selectively supply a data voltage to a third node which is a first electrode of the first-first transistor; a third-first transistor connected between the first node and a fourth node which is a second electrode of the first-second transistor; and a third-second transistor connected between the second node and the fourth node.

19 Claims, 10 Drawing Sheets

(56) References Cited

U.S. PATENT DOCUMENTS

| | | | |
|---|---|---|---|
| 2005/0275607 A1* | 12/2005 | Tobita | G09G 3/3283 345/76 |
| 2017/0287996 A1* | 10/2017 | Kim | H01L 27/3265 |
| 2018/0166516 A1* | 6/2018 | Chai | H01L 27/32 |
| 2018/0212014 A1* | 7/2018 | Choi | H01L 27/3276 |
| 2019/0251902 A1* | 8/2019 | Qian | G09G 3/3291 |
| 2020/0320937 A1* | 10/2020 | Yang | H01L 27/3262 |
| 2021/0280652 A1 | 9/2021 | Kim et al. | |

* cited by examiner

DISPLAY DEVICE WITH PIXEL CIRCUIT HAVING A PLURALITY OF TRANSISTORS

CROSS-REFERENCE TO RELATED APPLICATION

The present application claims priority to and the benefit of Korean Patent Application No. 10-2020-0066455 filed on Jun. 2, 2020, in the Korean Intellectual Property Office, the entire content of which is incorporated herein by reference.

BACKGROUND

1. Technical Field

Aspects of some example embodiments of the present disclosure relate to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, because each of pixels of a display panel may include a light emitting element capable of emitting light by itself, an image can be displayed without utilizing a backlight unit providing light to the display panel.

Each of the plurality of pixels of the display panel may include a plurality of thin film transistors. Each of the thin film transistors may be turned on based on a signal applied to the gate electrode. However, when the thin film transistor is switched from the turned-on state to the turned-off state, a leakage current may flow due to an electric field between a channel region and a source/drain region of the thin film transistor. The leakage current may lower the luminance of the pixel.

The above information disclosed in this Background section is only for enhancement of understanding of the background and therefore the information discussed in this Background section does not necessarily constitute prior art.

SUMMARY

Aspects of some example embodiments of the present disclosure include a display device capable of improving an image quality of the display device by reducing a leakage current flowing through a transistor of a pixel circuit, and preventing or reducing instances of a flicker by suppressing luminance drops of pixels in low-frequency driving.

However, aspects of the present disclosure are not restricted to the one set forth herein. The above and other aspects of the present disclosure will become more apparent to one of ordinary skill in the art to which the present disclosure pertains by referencing the detailed description of example embodiments according to the present disclosure given below.

According to some example embodiments of the present disclosure, a display device comprises a plurality of pixels on a substrate, each of the plurality of pixels including a light emitting element and a pixel circuit driving the light emitting element. The pixel circuit of each of the plurality of pixels comprises: a first-first transistor controlling a driving current flowing through the light emitting element based on a voltage of a first node, a first-second transistor connected in series with the first-first transistor and controlling the driving current based on a voltage of a second node, a second transistor selectively supplying a data voltage to a third node which is a first electrode of the first-first transistor, a third-first transistor connected between the first node and a fourth node which is a second electrode of the first-second transistor, and a third-second transistor connected between the second node and the fourth node.

According to some example embodiments, the second transistor, the third-first transistor, and the third-second transistor may be turned on based on a first gate signal received from a first gate line.

According to some example embodiments, the pixel circuit further may comprise: a first capacitor connected between the first node and a driving voltage line, and a second capacitor connected between the second node and the driving voltage line.

According to some example embodiments, the first-first transistor may include: a first electrode extending in a first direction, an active area connected to the first electrode and bent in a second direction crossing the first direction, a second electrode connected to the active area and bent in the first direction, and a gate electrode on the active area and overlapping the active area in a thickness direction.

According to some example embodiments, the first-second transistor may include: a first electrode connected to the second electrode of the first-first transistor and bent in the second direction, an active area connected to the first electrode and bent in the first direction, a second electrode connected to the active area and extending in the first direction, and a gate electrode on the active area and overlapping the active area in a thickness direction.

According to some example embodiments, the pixel circuit further may comprise a capacitor electrode on the gate electrode of the first-first transistor and the gate electrode of the first-second transistor. The first capacitor may be formed between the gate electrode of the first-first transistor and the capacitor electrode. The second capacitor may be formed between the gate electrode of the first-second transistor and the capacitor electrode.

According to some example embodiments, the pixel circuit further may comprise: a fourth-first transistor connected between the first node and an initialization voltage line, and a fourth-second transistor connected between the first node and the second node.

According to some example embodiments, the fourth-first transistor and the fourth-second transistor may be turned on based on a second gate signal received from a second gate line.

According to some example embodiments, the pixel circuit further may comprise: a fifth transistor connected between the third node and the driving voltage line, and a sixth transistor connected between the fourth node and a fifth node which is a first electrode of the light emitting element.

According to some example embodiments, the fifth transistor and the sixth transistor may be turned on based on an emission signal received from an emission control line.

According to some example embodiments, the pixel circuit further may comprise a seventh transistor connected between the initialization voltage line and the fifth node.

According to some example embodiments, the seventh transistor may be turned on based on a third gate signal received from a third gate line.

According to some example embodiments of the present disclosure, a display device comprises a plurality of pixels on a substrate, each of the plurality of pixels including a light emitting element and a pixel circuit driving the light emitting element. The pixel circuit of each of the plurality of pixels comprises: a first-first transistor controlling a driving current flowing through the light emitting element based on a voltage of a first node, a first-second transistor connected in series with the first-first transistor and controlling the driving current based on a voltage of a second node, a first capacitor connected between the first node and a driving voltage line, and a second capacitor connected between the second node and the driving voltage line.

According to some example embodiments, the pixel circuit further may comprise: a second transistor selectively supplying a data voltage to a third node which is a first electrode of the first-first transistor, a third-first transistor connected between the first node and a fourth node which is a second electrode of the first-second transistor, a third-second transistor connected between the second node and the fourth node, a fourth-first transistor connected between the first node and an initialization voltage line, and a fourth-second transistor connected between the first node and the second node.

According to some example embodiments, the second transistor, the third-first transistor, and the third-second transistor may be turned on based on a first gate signal received from a first gate line.

According to some example embodiments, the fourth-first transistor and the fourth-second transistor may be turned on based on a second gate signal received from a second gate line.

According to some example embodiments, the pixel circuit further may comprise: a fifth transistor connected between the third node and the driving voltage line, and a sixth transistor connected between the fourth node and a fifth node which is a first electrode of the light emitting element.

According to some example embodiments, the fifth transistor and the sixth transistor may be turned on based on an emission signal received from an emission control line.

According to some example embodiments, the pixel circuit further may comprise a seventh transistor connected between the initialization voltage line and the fifth node.

According to some example embodiments, the seventh transistor may be turned on based on a third gate signal received from a third gate line.

According to some example embodiments, the display device includes a first-first transistor and a first-second transistor connected in series, thereby increasing driving ranges of gate voltages of the first-first transistor and the first-second transistor. In the display device, by increasing the driving ranges of the gate voltages of the first-first transistor and the first-second transistor, it may be possible to further precisely control the gradation of light emitted from the light emitting element, resulting in relatively improved resolution of the display device and relatively improved display quality. Further, because the display device includes the first-first transistor and the first-second transistor, hysteresis may be reduced, thereby reducing the afterimage of the display device.

According to some example embodiments, the display device includes a third-first transistor connected to the gate electrode of the first-first transistor and a third-second transistor connected to the gate electrode of the first-second transistor, thereby minimizing the leakage currents of the gate electrode of the first-first transistor and the gate electrode of the first-second transistor. In the display device, the image quality can be improved by reducing the leakage current flowing through the pixel circuit, and the flicker can be prevented or reduced by suppressing the luminance drops of the pixels in the low-frequency driving.

The characteristics of embodiments according to the present disclosure are not limited to the aforementioned effects, and various other effects are included in the present specification.

BRIEF DESCRIPTION OF THE DRAWINGS

The above and other aspects and characteristics of embodiments according to the present disclosure will become more apparent by describing in more detail aspects of some example embodiments thereof with reference to the attached drawings, in which.

DETAILED DESCRIPTION

Figure 1:
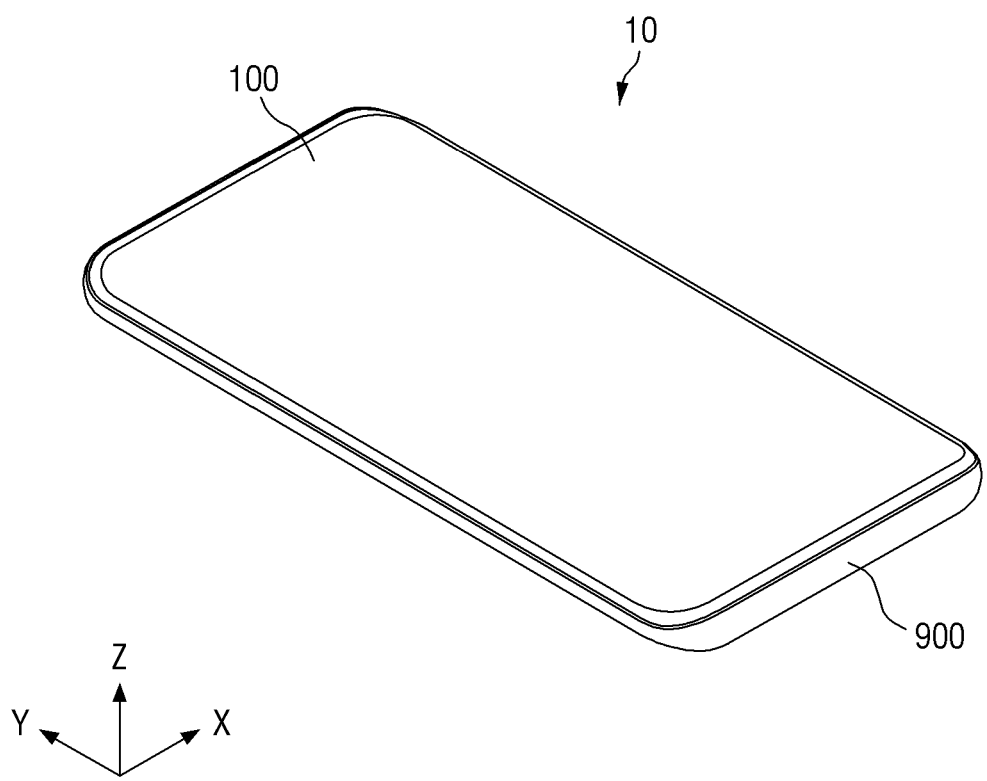
FIG. 1 is a perspective view illustrating a display device according to some example embodiments.

In the following description, for the purposes of explanation, numerous specific details are set forth in order to provide a thorough understanding of various example embodiments or implementations of the invention. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
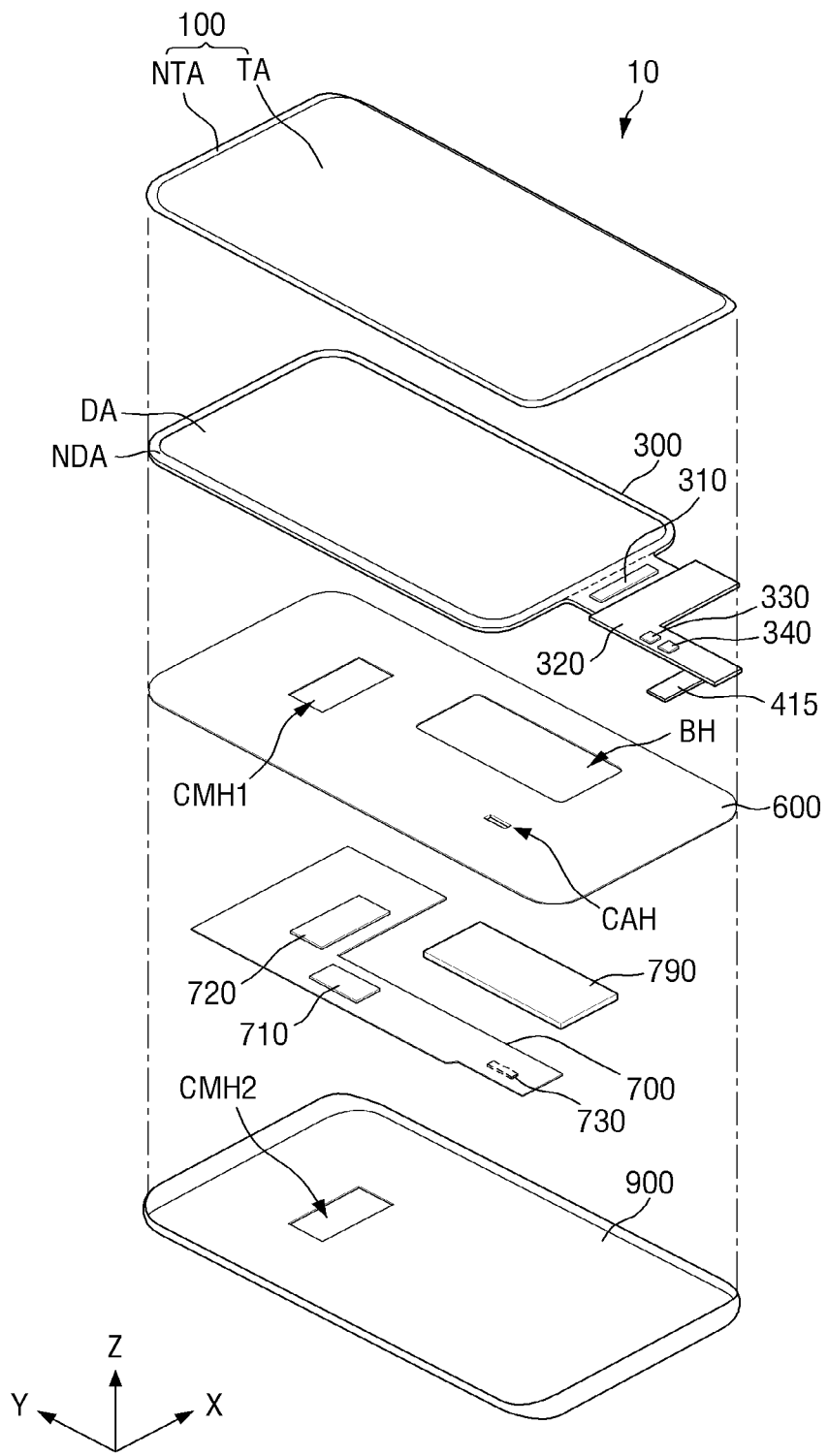
FIG. 2 is an exploded perspective view illustrating a display device according to some example embodiments.

FIG. 1 is a perspective view illustrating a display device according to some example embodiments. FIG. 2 is an exploded perspective view illustrating a display device according to some example embodiments.

Referring to FIGS. 1 and 2, a display device 10 includes a cover window 100, a display panel 300, a bracket 600, a main circuit board 700, and a lower cover 900.

The terms "above," "top" and "upper surface" as used herein refer to an upward direction (i.e., a Z-axis direction) with respect to the display device 10. The terms "below," "bottom" and "lower surface" as used herein refer to a downward direction (i.e., a direction opposite to the Z-axis direction) with respect to the display device 10. Further, "left", "right", "upper" and "lower" indicate directions when the display device 10 is viewed from above. For example, the term "left" indicates a direction opposite to an X-axis direction, the term "right" indicates the X-axis direction, the term "up" indicates a Y-axis direction, and the term "down" indicates a direction opposite to the Y-axis direction.

The display device 10 is a device for displaying a moving image (e.g., video images) or a still image (e.g., static images). The display device 10 may be used as a display screen of various products such as televisions, laptop computers, monitors, billboards and the Internet of Things (IOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 10 may have a rectangular shape in plan view. For example, the display device 10 may have a rectangular shape, in plan view, having short sides in a first direction (X-axis direction) and long sides in a second direction (Y-axis direction), as shown in FIGS. 1 and 2. The corner where the short side in the first direction (X-axis direction) and the long side in the second direction (Y-axis direction) meet may be rounded to have a curvature (e.g., a set or predetermined curvature) or may be right-angled. The planar shape of the display device 10 is not limited to a rectangular shape, and may be formed in other polygonal shapes, a circular shape, or elliptical shape.

The cover window 100 may be located or arranged on the display panel 300 to cover the top surface of the display panel 300. The cover window 100 may protect the top surface of the display panel 300.

The cover window 100 may include a transmissive area TA corresponding to a display area DA of the display panel 300 and a non-transmissive area NTA corresponding to a non-display area NDA of the display panel 300. For example, the non-transmissive area NTA may be formed opaquely. For another example, the non-transmissive area NTA may be formed as a decorative layer having a pattern that can be displayed to a user when images are not displayed.

The display panel 300 may be located or arranged below the cover window 100. Accordingly, images displayed by the display panel 300 may be viewed from the top surface of the display device 10 through the cover window 100.

The display panel 300 may be a light emitting display panel including a light emitting element. For example, the display panel 300 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting diode including an inorganic semiconductor.

The display panel 300 may include the display area DA and the non-display area NDA.

The display area DA may be located or arranged to overlap the transmissive area TA of the cover window 100. The display area DA may include a plurality of pixels displaying an image, and the non-display area NDA which is a peripheral area of the display area DA may not display an image. For example, the non-display area NDA may surround the display area DA, but embodiments according to the present disclosure are not limited thereto. The display area DA may occupy most of the area of the display panel 300.

For example, the display panel 300 may include a touch electrode layer for sensing an object such as a human finger, a pen or the like. The touch electrode layer may include a plurality of touch electrodes, and may be located or arranged on a display layer on which the plurality of pixels are located or arranged.

The display panel 300 may include a display driver 310, a circuit board 320, a power supply unit 330, and a touch driver 340.

The display driver 310 may output signals and voltages for driving the display panel 300. For example, the display driver 310 may supply a data voltage to the data line. The display driver 310 may supply a driving voltage or a source voltage to a driving voltage line, and may supply a gate control signal to the gate driver.

The circuit board 320 may be attached on a pad portion using an anisotropic conductive film (ACF). The lead lines of the circuit board 320 may be electrically connected to the pad portion of the display panel 300. For example, the circuit board 320 may be a flexible film, such as a flexible printed circuit board, a printed circuit board (PCB), or a chip on film (COF).

The power supply unit 330 may be located or arranged on the circuit board 320 to supply a driving voltage to the display driver 310 and the display panel 300. Specifically, the power supply unit 330 may generate a driving voltage and supply it to the driving voltage line, and may generate a common voltage and supply it to a low potential line. For example, the driving voltage may be a high potential voltage for driving the light emitting element, and the common voltage may be a low potential voltage for driving the light emitting element.

The touch driver 340 may be located or arranged on the circuit board 320 to measure the capacitance of the touch electrodes. For example, the touch driver 340 may determine whether the user has touched, the location of the user's touch and the like, based on the change in capacitance of the touch electrodes. Here, the user's touch means that an object such as a user's finger or pen is in direct contact with one surface of the display device 10 located or arranged on a touch electrode layer. The touch driver 340 may determine the user's touch position by distinguishing a portion of the plurality of touch electrodes where the user's touch occurs from a portion where no user's touch occurs.

The bracket 600 may be located or arranged below the display panel 300. The bracket 600 may be made of plastic, metal, or a combination thereof. For example, the bracket 600 may include a first camera hole CMH1 into which a first camera sensor 720 is inserted, a battery hole BH in which a battery is located or arranged, and a cable hole CAH through which a cable connected to the display driver 310 or the circuit board 320 passes.

The main circuit board 700 and the battery 790 may be located or arranged below the bracket 600. The main circuit board 700 may be a printed circuit board or a flexible printed circuit board.

The main circuit board 700 may include a main processor 710, a first camera sensor 720, and a main connector 730. The first camera sensor 720 may be located or arranged on both the top and bottom surfaces of the main circuit board 700, the main processor 710 may be located or arranged on the top surface of the main circuit board 700, and the main connector 730 may be located or arranged on the bottom surface of the main circuit board 700.

The main processor 710 may control all functions of the display device 10. For example, the main processor 710 may supply digital video data to the display driver 310 such that the display panel 300 displays an image. The main processor 710 may receive touch data from the touch driver 340 and determine the user's touch coordinates, and then execute an application indicated by an icon displayed on the user's touch coordinates.

The main processor 710 may convert first image data inputted from the first camera sensor 720 into digital video data and outputs it to the display driver 310 through the circuit board 320, thereby displaying an image captured by the first camera sensor 720 on the display panel 300.

The first camera sensor 720 may process an image frame of a still image or video obtained by the image sensor and output it to the main processor 710. For example, the first camera sensor 720 may be a CMOS image sensor or a CCD sensor, but embodiments according to the present disclosure are not limited thereto. The first camera sensor 720 may be exposed to the lower surface of the lower cover 900 by a second camera hole CMH2, and capture an image of a background or an object located or arranged below the display device 10.

The main connector 730 may be connected to the cable 415 that has passed through the cable hole CAH of the bracket 600. Thus, the main circuit board 700 may be electrically connected to the display driver 310 or the circuit board 320.

The battery 790 may be located or arranged so as not to overlap the main circuit board 700 in the third direction (Z-axis direction). The battery 790 may overlap the battery hole BH of the bracket 600.

The main circuit board 700 may further include a mobile communication module capable of transmitting and receiving radio signals with at least one of a base station, an external terminal, or a server in a mobile communication network. The wireless signal may include various types of data according to transmission and reception of a voice signal, a video call signal, or a text/multimedia message.

The lower cover 900 may be located or arranged below the main circuit board 700 and the battery 790. The lower cover 900 may be fixed by being fastened to the bracket 600. The lower cover 900 may form an external appearance of the bottom surface of the display device 10. The lower cover 900 may be made of plastic, metal, or a combination thereof.

The lower cover 900 may include a second camera hole CMH2 through which the lower surface of the first camera sensor 720 is exposed. The position of the first camera sensor 720 and the positions of the first and second camera holes CMH1 and CMH2 corresponding to the first camera sensor 720 are not limited to the embodiment illustrated in FIG. 2.

Figure 3:
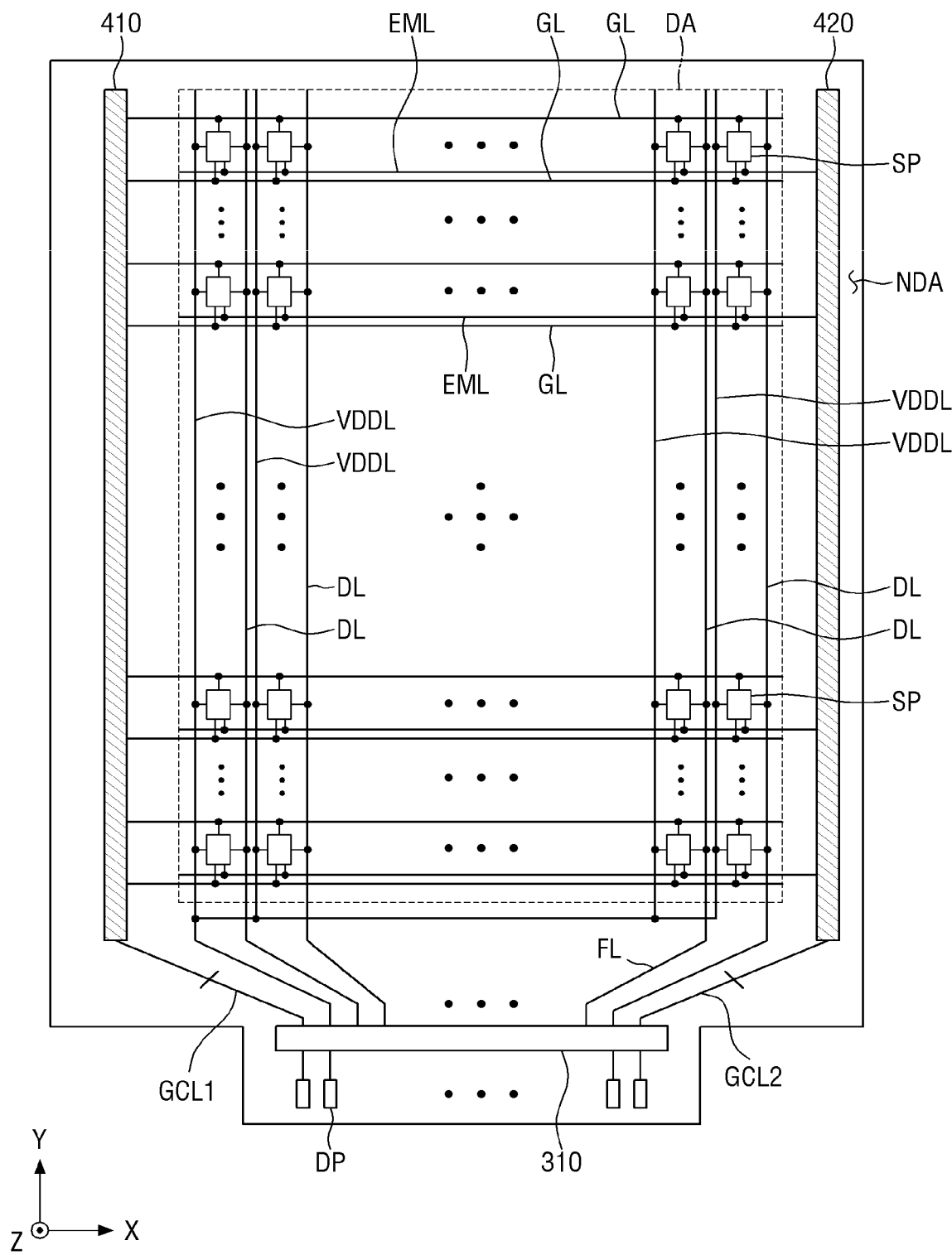
FIG. 3 is a plan view illustrating a display panel according to some example embodiments.
Figure 4:
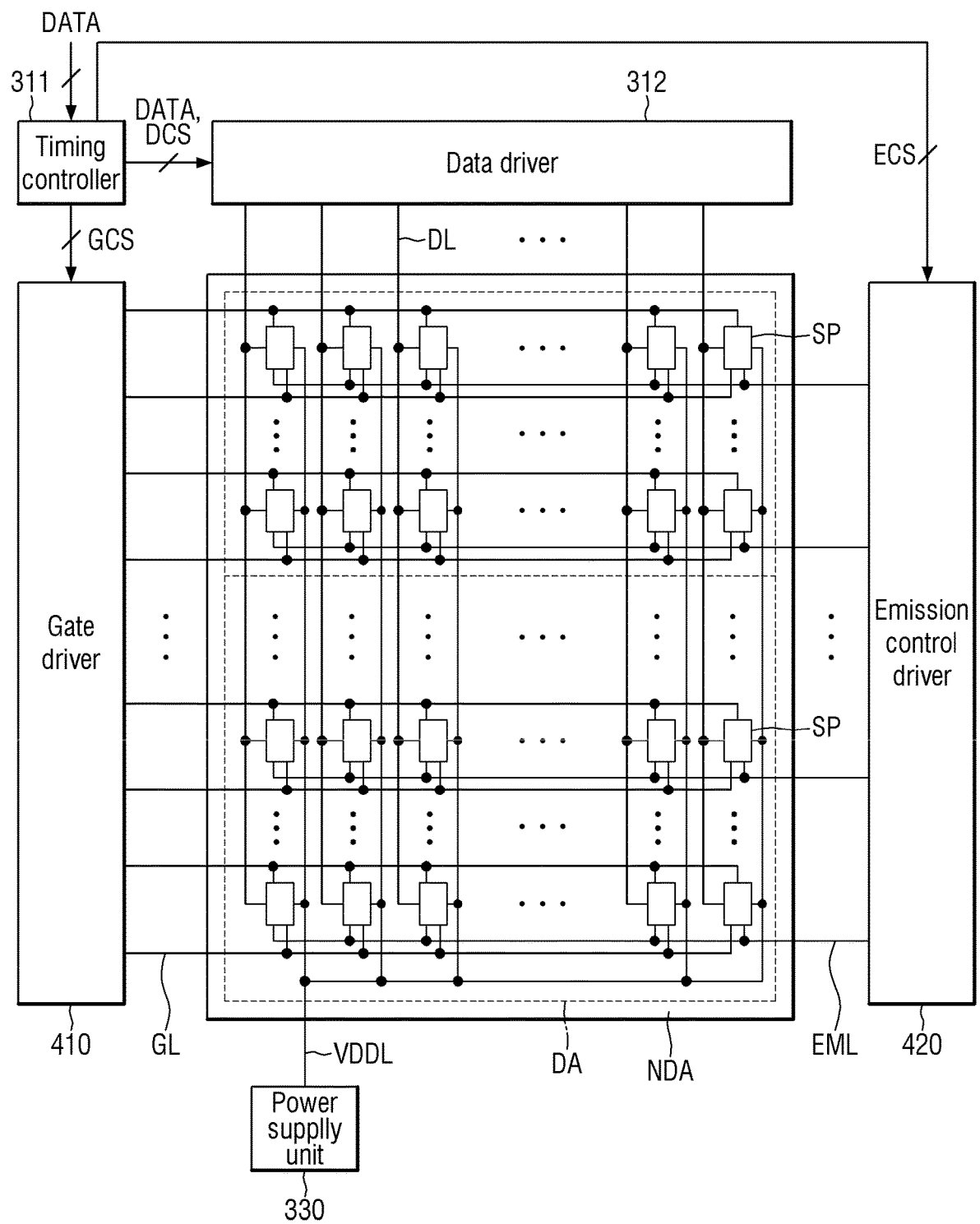
FIG. 4 is a block diagram illustrating a display panel and a display driving unit according to some example embodiments.

FIG. 3 is a plan view illustrating a display panel according to some example embodiments. FIG. 4 is a block diagram illustrating a display panel and a display driving unit according to some example embodiments.

Referring to FIGS. 3 and 4, the display panel 300 may include the display area DA and the non-display area NDA.

The display area DA may include a plurality of pixels SP, driving voltage lines VDDL connected to the plurality of pixels SP, gate lines GL, emission control lines EML, and data lines DL.

The pixels SP may be connected to at least one gate line GL, at least one data line DL, at least one emission control line EML, and at least one driving voltage line VDDL. In FIGS. 3 and 4, each of the pixels SP may be connected to two gate lines GL, one data line DL, one emission control line EML, and one driving voltage line VDDL, but embodiments according to the present disclosure are not limited thereto. For example, each of the pixels SP may be connected to three or more gate lines GL.

Each of the pixels SP may include at least one transistor, a light emitting element, and a capacitor.

The pixels SP2 may receive a driving voltage VDD through the driving voltage line VDDL. Here, the driving voltage VDD may be a high potential voltage for driving the light emitting element of the pixels SP.

The gate lines GL and the emission control lines EML may extend in the first direction (X-axis direction) and may be spaced apart from each other in the second direction (Y-axis direction) intersecting the first direction (X-axis direction).

The data lines DL and the driving voltage lines VDDL may extend in the second direction (Y-axis direction) and may be spaced apart from each other in the first direction (X-axis direction).

The non-display area NDA may be defined as the remaining area of the display panel 300 except for the display area DA. The non-display area NDA may include a gate driver 410 for applying gate signals to the gate lines GL, an emission control driver 420 for applying emission signals to the emission control lines EML, fan-out lines FL connecting the data lines DL to the display driver 310 and pads DP connected to the circuit board 320. The display driver 310 and the pads DP may be located or arranged in the pad area of the display panel 300. The pads DP may be located or arranged closer to one edge of the pad area than the display driver 310.

In FIG. 4, the display driver 310 may include a timing controller 311 and a data driver 312.

The timing controller 311 may receive digital video data DATA and timing signals from the circuit board 320. The timing controller 311 may generate, based on the timing signals, a data control signal DCS to control the operation timing of the data driver 312, a gate control signal GCS to control the operation timing of the gate driver 410, and an emission control signal ECS to control the operation timing of the emission control driver 420. The timing controller 311 may output the gate control signal GCS to the gate driver 410 through a first gate control line GCL1. The timing controller 311 may output the emission control signal ECS to the emission control driver 420 through a second gate control line GCL2. The timing controller 311 may output the digital video data DATA and the data control signal DCS to the data driver 312.

The data driver 312 may convert the digital video data DATA into analog data voltages and output them to the data lines DL through the fan-out lines FL. The gate signals of the gate driver 410 may select pixels SP to which the data voltage is supplied, and the selected pixels SP may receive the data voltage through the data lines DL.

In FIG. 3, the gate driver 410 may be located or arranged outside one side of the display area DA or on one side of the non-display area NDA. The emission control driver 420 may be located or arranged outside the other side of the display area DA or on the other side of the non-display area NDA. For another example, both the gate driver 410 and the emission control driver 420 may be located or arranged outside one side of the display area DA.

The gate driver 410 may include a plurality of transistors for generating gate signals based on the gate control signal GCS, and the emission control driver 420 may include a plurality of transistors for generating emission signals based on the emission control signal ECS. For example, the transistors of the gate driver 410 and the transistors of the emission control driver 420 may be formed in the same layer as the transistors of each pixel SP.

Figure 5:
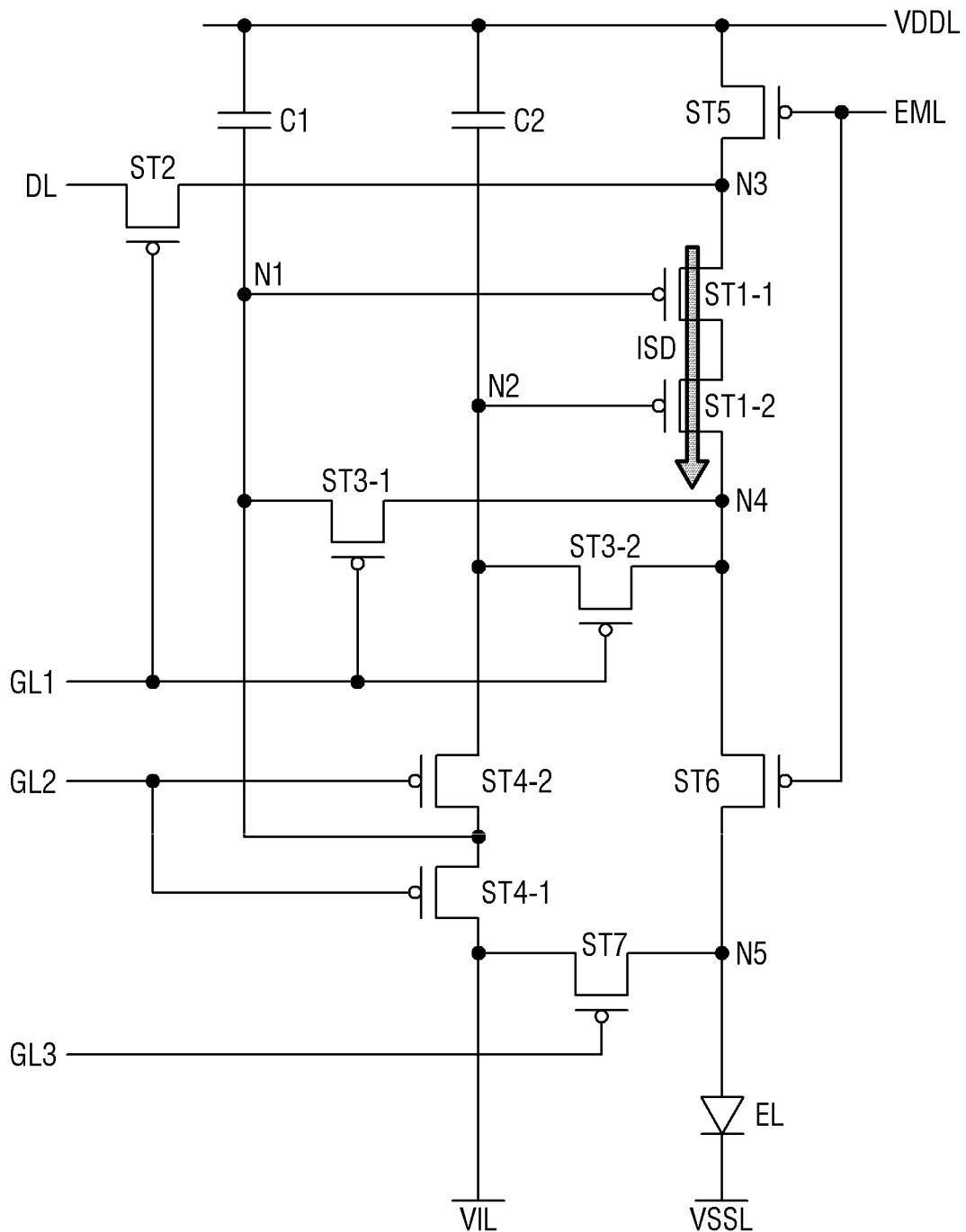
FIG. 5 is a circuit diagram illustrating a pixel of a display device according to some example embodiments.

FIG. 5 is a circuit diagram illustrating a pixel of a display device according to some example embodiments.

Referring to FIG. 5, the display panel 300 may include a plurality of pixels SP arranged along k rows (k is a natural number) and j columns (j is a natural number). Each of the pixels SP may be connected to a first gate line GL1, a second gate line GL2, a third gate line GL3, the emission control line EML, the data line DL, the driving voltage line VDDL, and an initialization voltage line VIL.

Each of pixels SP may include a light emitting element EL and a pixel circuit for driving the light emitting element EL. The pixel circuit may include a plurality of switching elements and a plurality of capacitors. The plurality of switching elements may include first to seventh transistors ST1, ST2, ST3, ST4, ST5, ST6, and ST7. The plurality of capacitors may include first and second capacitors C1 and C2.

The first transistor ST1 may control a driving current flowing through the light emitting element EL. The first transistor ST1 may include a first-first transistor ST1-1 and a first-second transistor ST1-2 connected in series.

The first-first transistor ST1-1 may include a gate electrode, a first electrode, and a second electrode. For example, the first electrode of the first-first transistor ST1-1 may be a source electrode and the second electrode of the first-first transistor ST1-1 may be a drain electrode, but embodiments according to the present disclosure are not limited thereto. The gate electrode of the first-first transistor ST1-1 may be connected to a first node N1, the first electrode thereof may be connected to a third node N3, and the second electrode thereof may be connected to the first electrode of the first-second transistor ST1-2. The first-first transistor ST1-1 may control a source-drain current ISD (hereinafter, referred to as "driving current") based on a part of a data voltage (hereinafter, denoted by "Vdata") applied to the gate electrode.

The first-second transistor ST1-2 may include a gate electrode, a first electrode, and a second electrode. For example, the first electrode of the first-second transistor ST1-2 may be a source electrode and the second electrode of the first-second transistor ST1-2 may be a drain electrode, but embodiments according to the present disclosure are not limited thereto. The gate electrode of the first-second transistor ST1-2 may be connected to a second node N2, the first electrode thereof may be connected to the second electrode of the first-first transistor ST1-1, and the second electrode thereof may be connected to a fourth node N4. The first-second transistor ST1-2 may control the driving current ISD based on the other part of the data voltage Vdata applied to the gate electrode.

That is, the first-first transistor ST1-1 and the first-second transistor ST1-2 are connected in series to control the driving current ISD. The first-first transistor ST1-1 may control the driving current ISD based on the voltage of the first node N1, and the first-second transistor ST1-2 may control the driving current ISD based on the voltage of the second node N2 which is isolated from the first node N1. A part of the data voltage Vdata applied to the pixel circuit may be applied to the first node N1 through the second transistor ST2, the first transistor ST1, and a third-first transistor ST3-1. The other part of the data voltage Vdata may be applied to the second node N2 through the second transistor ST2, the first transistor ST1, and a third-second transistor ST3-2. The pixel circuit of the display device 10 includes the first-first transistor ST1-1 and the first-second transistor ST1-2, thereby increasing the driving range of the gate voltage applied to the first node N1 or the second node N2. In the display device 10, since the driving range of the gate voltage of the first transistor ST1 is increased, the gradation of light emitted from the light emitting element EL can be further precisely controlled, resulting in increasing the resolution of the display device 10 and improving the display quality. Further, since the pixel circuit of the display device 10 includes the first-first transistor ST1-1 and the first-second transistor ST1-2, hysteresis can be reduced, thereby reducing the afterimage of the display device 10.

The light emitting element EL may emit light by receiving the driving current ISD. The emission amount or the luminance of the light emitting element EL may be proportional to the magnitude of the driving current ISD. The light emitting element EL may be an inorganic light emitting element including a first electrode, a second electrode, and an inorganic semiconductor located or arranged between the first electrode and the second electrode, but embodiments according to the present disclosure are not limited thereto. The first electrode of the light emitting element EL may be connected to a fifth node N5. The first electrode of the light emitting element EL may be connected to the second electrode of the sixth transistor ST6 and the second electrode of the seventh transistor ST7 through the fifth node N5. For example, the first electrode of the light emitting element EL may be an anode electrode, and the second electrode thereof may be a cathode electrode, but embodiments according to the present disclosure are not limited thereto.

The second transistor ST2 may be turned on by a first gate signal of the first gate line GL1 to connect the data line DL to the third node N3 that is the first electrode of the first-first transistor ST1-1. The second transistor ST2 may be turned on based on the first gate signal to supply the data voltage Vdata to the third node N3. The gate electrode of the second transistor ST2 may be connected to the first gate line GL1, the first electrode thereof may be connected to the data line DL, and the second electrode thereof may be connected to the third node N3. The second electrode of the second transistor ST2 may be connected to the first electrode of the first-first transistor ST1-1 and the second electrode of the fifth transistor ST5 through the third node N3. For example, the first electrode of the second transistor ST2 may be a source electrode and the second electrode thereof may be a drain electrode, but embodiments according to the present disclosure are not limited thereto.

The third transistor ST3 may be turned on by the first gate signal of the first gate line GL1 to connect the second electrode of the first transistor ST1 to the gate electrode of the first transistor ST1. The third transistor ST3 may include the third-first transistor ST3-1 and the third-second transistor ST3-2.

The third-first transistor ST3-1 may be turned on by the first gate signal of the first gate line GL1 to connect the fourth node N4, which is the second electrode of the first-second transistor ST1-2, to the first node N1 which is the gate electrode of the first-first transistor ST1-1. The gate electrode of the third-first transistor ST3-1 may be connected to the first gate line GL1, the first electrode thereof may be connected to the fourth node N4, and the second electrode thereof may be connected to the first node N1. The first electrode of the third-first transistor ST3-1 may be connected to the second electrode of the first-second transistor ST1-2, the first electrode of the third-second transistor ST3-2, and the first electrode of the sixth transistor ST6 through the fourth node N4. The second electrode of the third-first transistor ST3-1 may be connected to the gate electrode of the first-first transistor ST1-1 and the first electrode of the first capacitor C1 through the first node N1, a second electrode of a fourth-first transistor ST4-1, and a first electrode of a fourth-second transistor ST4-2. For example, the first electrode of the third-first transistor ST3-1 may be a source electrode and the second electrode thereof may be a drain electrode, but embodiments according to the present disclosure are not limited thereto.

The third-second transistor ST3-2 may be turned on by the first gate signal of the first gate line GL1 to connect the fourth node N4, which is the second electrode of the first-second transistor ST1-2 to the second node N2 which is the gate electrode of the first-second transistor ST1-2. The gate electrode of the third-second transistor ST3-2 may be connected to the first gate line GL1, the first electrode thereof may be connected to the fourth node N4, and the second electrode thereof may be connected to the second node N2. The first electrode of the third-second transistor ST3-2 may be connected to the second electrode of the first-second transistor ST1-2 and the first electrode of the third-first transistor ST3-1 through the fourth node N4, and the first electrode of the sixth transistor ST6. The second electrode of the third-second transistor ST3-2 may be connected to the gate electrode of the first-second transistor ST1-2 and the first electrode of the second capacitor C2 through the second node N2, and the second electrode of the fourth-second transistor ST4-2. For example, the first electrode of the third-second transistor ST3-2 may be a source electrode and the second electrode thereof may be a drain electrode, but embodiments according to the present disclosure are not limited thereto.

Therefore, in the pixel circuit of the display device 10, a difference voltage between a part of the data voltage and a threshold voltage is sampled through the third-first transistor ST3-1 to be applied to the gate electrode of the first-first transistor ST1-1, and a difference voltage between the other part of the data voltage and a threshold voltage is sampled through the third-second transistor ST3-2 to be applied to the gate electrode of the first-second transistor ST1-2, thereby increasing the driving ranges of the gate voltages of the respective first-first transistor ST1-1 and first-second transistor ST1-2. In the display device 10, since the driving range of the gate voltage of the first transistor ST1 is increased, the gradation of light emitted from the light emitting element EL can be further precisely controlled, resulting in an increase in the resolution of the display device 10 and improving the display quality.

The fourth transistor ST4 may be turned on by a second gate signal of the second gate line GL2 to connect the initialization voltage line VIL to the gate electrode of the first transistor ST1. The fourth transistor ST4 may include the fourth-first transistor ST4-1 and the fourth-second transistor ST4-2.

The fourth-first transistor ST4-1 may be turned on based on the second gate signal of the second gate line GL2, thereby discharging the first node N1, which is the gate electrode of the first-first transistor ST1-1, to an initialization voltage VI. The gate electrode of the fourth-first transistor ST4-1 may be connected to the second gate line GL2, the first electrode thereof may be connected to the initialization voltage line VIL, and the second electrode thereof may be connected to the first node N1. The second electrode of the fourth-first transistor ST4-1 may be connected to the gate electrode of the first-first transistor ST1-1 and the first electrode of the first capacitor C1 through the first node N1, the second electrode of the third-first transistor ST3-1, and the first electrode of the fourth-second transistor ST4-2. For example, the first electrode of the fourth-first transistor ST4-1 may be a source electrode and the second electrode thereof may be a drain electrode, but embodiments according to the present disclosure are not limited thereto.

The fourth-second transistor ST4-2 may be turned on based on the second gate signal of the second gate line GL2, thereby discharging the second node N2, which is the gate electrode of the first-second transistor ST1-2, to the initialization voltage VI. The gate electrode of the fourth-second transistor ST4-2 may be connected to the second gate line GL2, the first electrode thereof may be connected to the first node N1, and the second electrode thereof may be connected to the second node N2. The first electrode of the fourth-second transistor ST4-2 may be connected to the gate electrode of the first-first transistor ST1-1 and the first electrode of the first capacitor C1 through the first node N1, the second electrode of the third-first transistor ST3-1 and the second electrode of the fourth-first transistor ST4-1. The second electrode of the fourth-second transistor ST4-2 may be connected to the gate electrode of the first-second transistor ST1-2 and the first electrode of the second capacitor C2 through the second node N2, and the second electrode of the third-second transistor ST3-2. For example, the first electrode of the fourth-second transistor ST4-2 may be a source electrode and the second electrode thereof may be a drain electrode, but embodiments according to the present disclosure are not limited thereto.

The fifth transistor ST5 may be turned on by the emission signal of the emission control line EML to connect the driving voltage line VDDL to the third node N3 that is the first electrode of the first-first transistor ST1-1. The gate electrode of the fifth transistor ST5 may be connected to the emission control line EML, the first electrode thereof may be connected to the driving voltage line VDDL, and the second electrode thereof may be connected to the third node N3. The second electrode of the fifth transistor ST5 may be connected to the first electrode of the first-first transistor ST1-1 and the second electrode of the second transistor ST2 through the third node N3. For example, the first electrode of the fifth transistor ST5 may be a source electrode and the second electrode thereof may be a drain electrode, but embodiments according to the present disclosure are not limited thereto.

The sixth transistor ST6 may be turned on by the emission signal of the light emission control line EML to connect the fourth node N4, which is the second electrode of the first-second transistor ST1-2, to the fifth node N5 which is the first electrode of the light emitting element EL. The gate electrode of the sixth transistor ST6 may be connected to the emission control line EML, the first electrode thereof may be connected to the fourth node N4, and the second electrode thereof may be connected to the fifth node N5. The first electrode of the sixth transistor ST6 may be connected to the second electrode of the first-second transistor ST1-2 and the first electrode of the third-first transistor ST3-1 through the fourth node N4, and the first electrode of the third-second transistor ST3-2. The second electrode of the sixth transistor ST6 may be connected to the first electrode of the light emitting element EL and the second electrode of the seventh transistor ST7 through the fifth node N5. For example, the first electrode of the sixth transistor ST6 may be a source electrode and the second electrode thereof may be a drain electrode, but embodiments according to the present disclosure are not limited thereto.

When the fifth transistor ST5, the first-first transistor ST1-1, the first-second transistor ST1-2, and the sixth transistor ST6 are all turned on, the driving current ISD may be supplied to the light emitting element EL.

The seventh transistor ST7 may be turned on by a third gate signal of the third gate line GL3 to connect the initialization voltage line VIL to the fifth node N5 which is the first electrode of the light emitting element EL. By turning on the seventh transistor ST7 based on the third gate signal, the first electrode of the light emitting element EL may be discharged to the initialization voltage VI. The gate electrode of the seventh transistor ST7 may be connected to the third gate line GL3, the first electrode thereof may be connected to the initialization voltage line VIL, and the second electrode thereof may be connected to the fifth node N5. The second electrode of the seventh transistor ST7 may be connected to the first electrode of the light emitting element EL and the second electrode of the sixth transistor ST6 through the fifth node N5.

Each of the first to seventh transistors ST1 to ST7 may include a silicon-based active layer. For example, each of the first to seventh transistors ST1 to ST7 may include an active layer made of low-temperature polycrystalline silicon (LTPS). The active layer made of low-temperature polycrystalline silicon may have high electron mobility and excellent turn-on characteristics. That is, the pixel circuit of the display device 10 includes the first to seventh transistors ST1 to ST7 having excellent turn-on characteristics, so that the plurality of pixels SP can be stably and efficiently driven.

Each of the first to seventh transistors ST1 to ST7 may correspond to a p-type transistor. For example, each of the first to seventh transistors ST1 to ST7 may output a current that flows into the first electrode to the second electrode based on a gate low voltage applied to the gate electrode.

The first capacitor C1 may be connected between the driving voltage line VDDL and the first node N1 which is the gate electrode of the first-first transistor ST1-1. For example, the first electrode of the first capacitor C1 may be connected to the first node N1, and the second electrode of the first capacitor C1 may be connected to the driving voltage line VDDL, thereby maintaining the potential difference between the driving voltage line VDDL and the gate electrode of the first-first transistor ST1-1.

The second capacitor C2 may be connected between the driving voltage line VDDL and the second node N2 which is the gate electrode of the first-second transistor ST1-2. For example, the first electrode of the second capacitor C2 may be connected to the second node N2, and the second electrode of the second capacitor C1 may be connected to the driving voltage line VDDL, thereby maintaining the potential difference between the driving voltage line VDDL and the gate electrode of the first-second transistor ST1-2.

Figure 6:
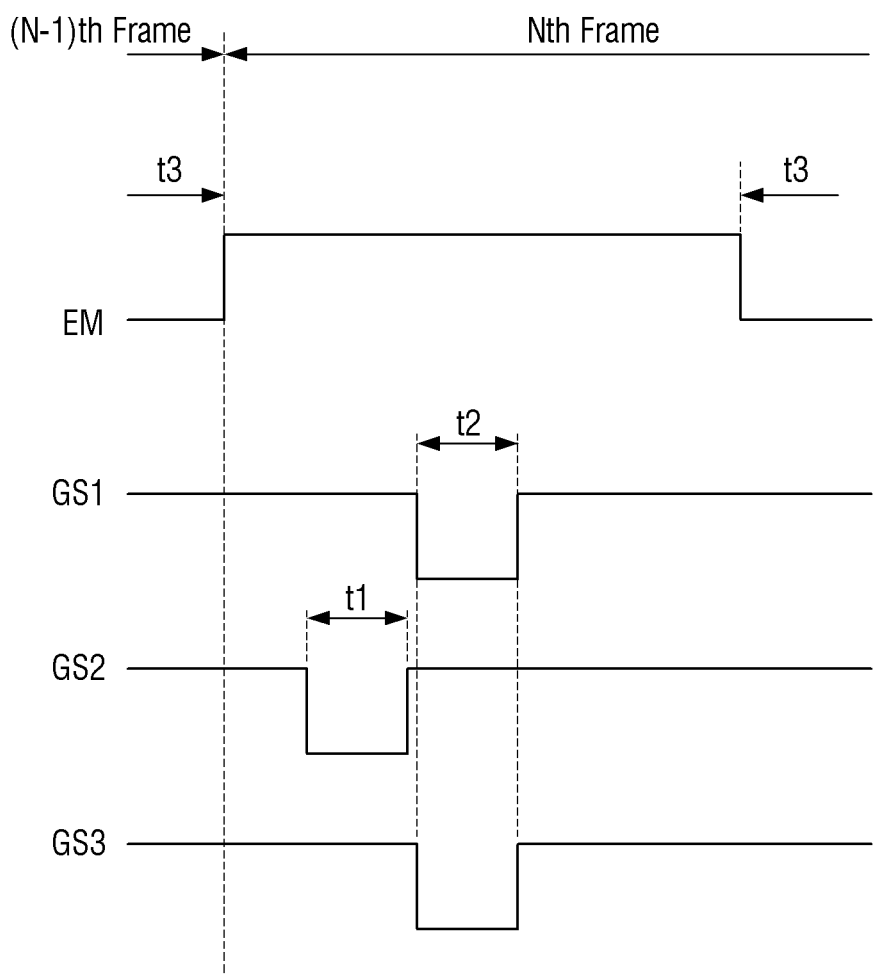
FIG. 6 is a waveform diagram of signals supplied to the pixel illustrated in FIG. 5 according to some example embodiments.

FIG. 6 is a waveform diagram of signals supplied to the pixel illustrated in FIG. 5.

Referring to FIG. 6, the display device 10 may be driven through first to third periods t1 to t3 per frame. The pixel SP may receive first to third gate signals GS1, GS2, and GS3, and the emission signal EM.

Referring to FIG. 6 in conjunction with FIG. 5, the fourth-first transistor ST4-1 and the fourth-second transistor ST4-2 may receive the second gate signal GS2 of a low level during the first period t1 of the Nth frame ("N" is a natural number equal to or greater than 2). The fourth-first transistor ST4-1 may be turned on based on the second gate signal GS2 of a low level to supply the initialization voltage VI to the first node N1 which is the gate electrode of the first-first transistor ST1-1. Therefore, the fourth-first transistor ST4-1 may initialize the gate electrode of the first-first transistor ST1-1 during the first period t1.

The fourth-second transistor ST4-2 may be turned on based on the second gate signal GS2 of a low level to supply the initialization voltage VI to the second node N2 that is the gate electrode of the first-second transistor ST1-2. Therefore, the fourth-second transistor ST4-2 may initialize the gate electrode of the first-second transistor ST1-2 during the first period t1.

The second transistor ST2 may receive the first gate signal GS1 of a low level during the second period t2. The second transistor ST2 may be turned on based on the first gate signal GS1 of a low level to supply the data voltage Vdata to the third node N3 that is the first electrode of the first-first transistor ST1-1.

When the source electrode of the first-first transistor ST1-1 receives the data voltage Vdata, a source-gate voltage Vsg of the first-first transistor ST1-1 may correspond to a difference voltage (Vdata−VI) between the data voltage Vdata and the initialization voltage VI. The first-first transistor ST1-1 may be turned on because the source-gate voltage Vsg becomes greater than a first threshold voltage (hereinafter, denoted by "Vth1") (Vdata−VI≥Vth1). When the first-first transistor ST1-1 is turned on, a source-gate voltage Vsg of the first-second transistor ST1-2 may be a voltage (Vdata−Vth1−VI) obtained by subtracting the first threshold voltage Vth1 and the initialization voltage VI from the data voltage Vdata. The first-second transistor ST1-2 may be turned on because the source-gate voltage Vsg of the first-second transistor ST1-2 becomes greater than a second threshold voltage (hereinafter, denoted by "Vth2") (Vdata−Vth1−VI>=Vth2).

When the first-first transistor ST1-1 and the first-second transistor ST1-2 are turned on in the second period t2, the source-drain current ISD of the first-first transistor ST1-1 and the first-second transistor ST1-2 may be determined according to the data voltage Vdata, the initialization voltage VI, the first threshold voltage Vth1 of the first-first transistor ST1-1, and the second threshold voltage Vth2 of the first-second transistor ST1-2 (ISD=k'*(Vdata−VI−Vth1−Vth2)^2). The first-first transistor ST1-1 may be turned on until the source-gate voltage Vsg thereof reaches the first threshold voltage Vth1, and the first-second transistor ST1-2 may be turn on until the source-gate voltage Vsg thereof reaches the second threshold voltage Vth2, so that the source-drain current ISD can be supplied to the fourth node N4. Therefore, the first-first transistor ST1-1 and the first-second transistor ST1-2 are turned on during the second period t2 to supply the voltage of the third node N3 to the fourth node N4. In this way, while the first-first transistor ST1-1 and the first-second transistor ST1-2 are turned on, the source-drain current ISD and the voltage of the fourth node N4 may be changed. Accordingly, the voltage of the fourth node N4 may eventually converge to a voltage (Vdata−Vth1−Vth2) obtained by subtracting the first threshold voltage Vth1 and the second threshold voltage Vth2 from the data voltage Vdata.

The seventh transistor ST7 may receive the third gate signal GS3 of a low level during the second period t2. The seventh transistor ST7 may be turned on based on the third gate signal GS3 of a low level to supply the initialization voltage VI to the fifth node N5 that is the first electrode of the light emitting element EL. Accordingly, the seventh transistor ST7 may initialize the first electrode of the light emitting element EL during the second period t2.

The emission signal EM may have a gate low voltage during the third period t3. When the emission signal EM has a low level, the fifth and sixth transistors ST5 and ST6 may be turned on to supply a driving current to the light emitting element EL.

Figure 7:
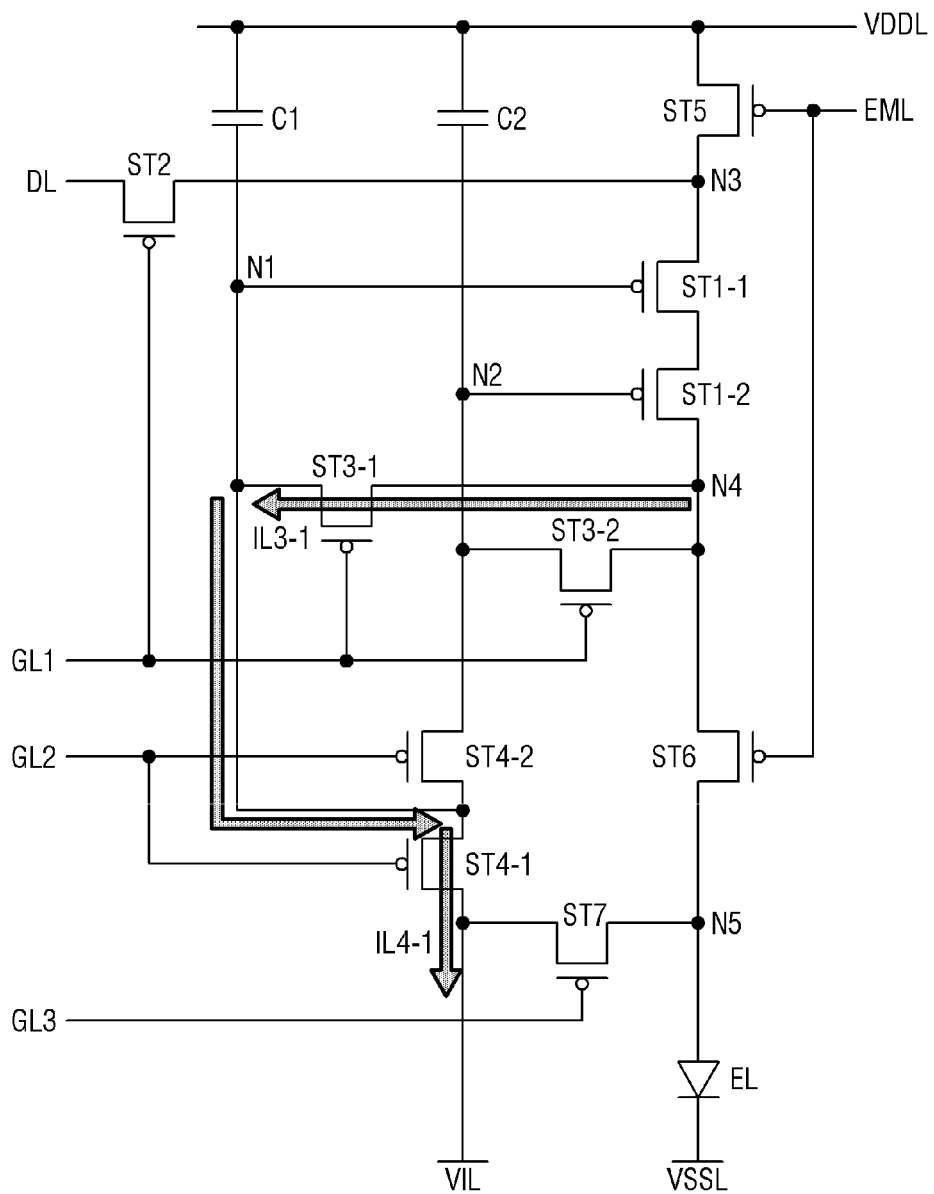
FIG. 7 is a circuit diagram illustrating an example of a leakage current in the pixel illustrated in FIG. 5 according to some example embodiments.
Figure 8:
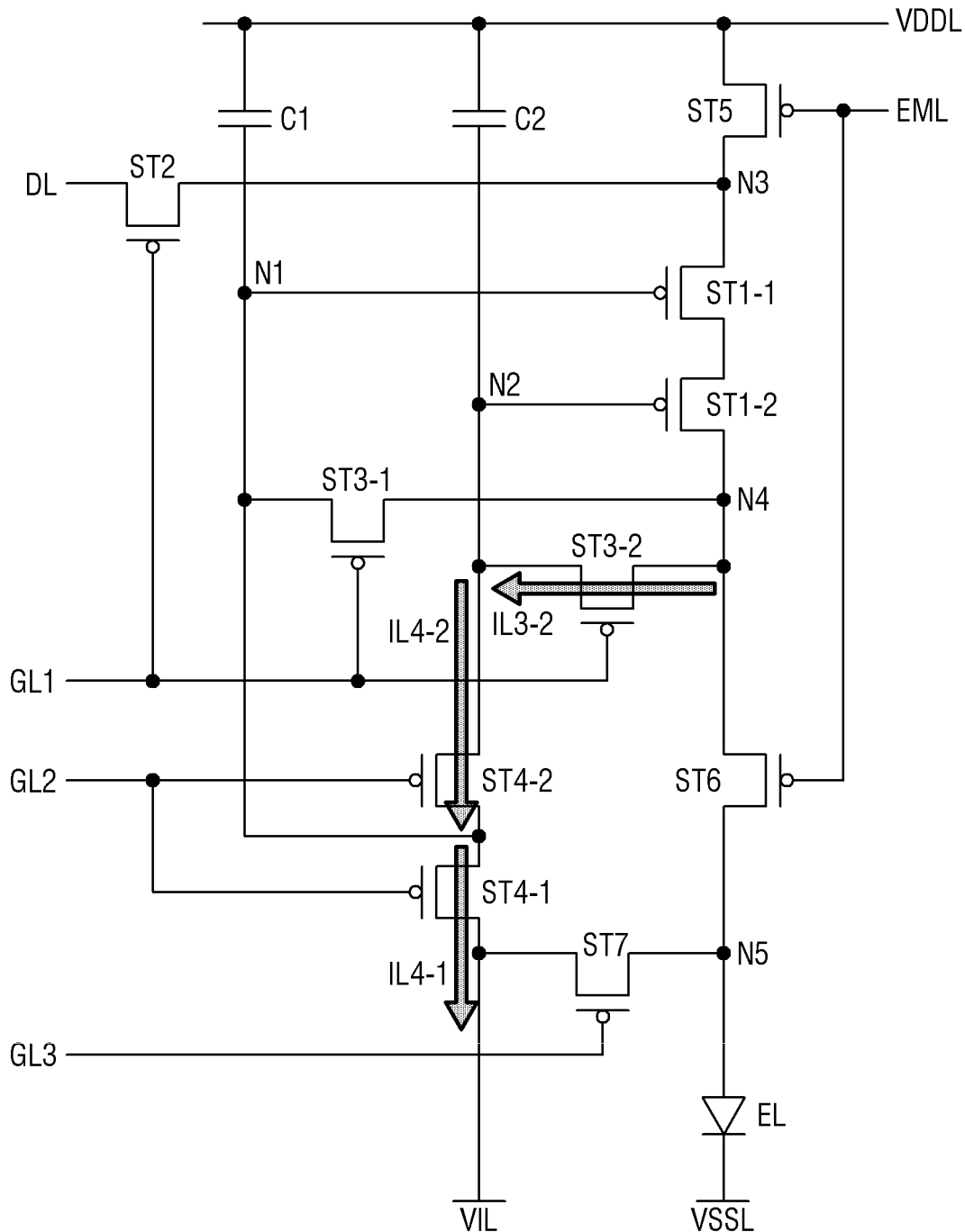
FIG. 8 is a circuit diagram illustrating an example of a leakage current in the pixel illustrated in FIG. 5 according to some example embodiments.

FIG. 7 is a circuit diagram illustrating an example of a leakage current in the pixel illustrated in FIG. 5. FIG. 8 is a circuit diagram illustrating another example of a leakage current in the pixel illustrated in FIG. 5.

Referring to FIGS. 7 and 8, the third-first transistor ST3-1 may be turned off by receiving the first gate signal GS1 of a high level. While the third-first transistor ST3-1 is turned off, a leakage current IL3-1 of the third-first transistor ST3-1 may flow. The leakage current IL3-1 of the third-first transistor ST3-1 may accumulate charges in the second electrode of the fourth-first transistor ST4-1 or in the first electrode of the fourth-second transistor ST4-2 to increase the voltage of the first node N1. As the voltage of the first node N1 increases, a leakage current IL4-1 of the fourth-first transistor ST4-1 may flow. Therefore, the voltage of the first node N1 may be balanced by the leakage current IL3-1 of the third-first transistor ST3-1 and the leakage current IL4-1 of the fourth-first transistor ST4-1. In the display device 10, the voltage of the first node N1 can be stably maintained by minimizing a difference current (IL3-1-IL4-1) between the leakage current IL3-1 of the third-first transistor ST3-1 and the leakage current IL4-1 of the fourth-first transistor ST4-1.

The third-second transistor ST3-2 may be turned off by receiving the first gate signal GS1 of a high level. While the third-second transistor ST3-2 is turned off, a leakage current IL3-2 of the third-second transistor ST3-2 may flow. The leakage current IL3-2 of the third-second transistor ST3-2 may accumulate charges in the second electrode of the fourth-second transistor ST4-2 to increase the voltage of the second node N2. As the voltage of the second node N2 increases, a leakage current IL4-2 of the fourth-second transistor ST4-2 may flow. The leakage current IL4-2 of the fourth-second transistor ST4-2 may accumulate charges in the second electrode of the fourth-first transistor ST4-1 or in the first electrode of the fourth-second transistor ST4-2 to increase the voltage of the first node N1. As the voltage of the first node N1 increases, the leakage current IL4-1 of the fourth-first transistor ST4-1 may flow. Therefore, the voltage of the second node N2 may be balanced by the leakage current IL3-2 of the third-second transistor ST3-2 and the leakage current IL4-2 of the fourth-second transistor ST4-2. In the display device 10, the voltage of the second node N2 can be stably maintained by minimizing a difference current (IL3-2−IL4-2) between the leakage current IL3-2 of the third-second transistor ST3-2 and the leakage current IL4-2 of the fourth-second transistor ST4-2.

Since the display device 10 includes the third-first transistor ST3-1 connected to the first node N1 which is the gate electrode of the first-first transistor ST1-1 and the third-second transistor ST3-2 connected to the second node N2 which is the gate electrode of the first-second transistor ST1-2, the leakage currents of the first and second nodes N1 and N2 can be minimized. In the display device 10, the voltage of the first node N1 can be stably maintained through a first leakage path leading through the third-first transistor ST3-1 and the fourth-first transistor ST4-1. Further, the voltage of the second node N2 can be stably maintained through a second leakage path leading through the third-second transistor ST3-2, the fourth-second transistor ST4-2, and the fourth-first transistor ST4-1. That is, in the display device 10, the voltage of the first node N1 which is the gate electrode of the first-first transistor ST1-1 and the voltage of the second node N2 which is the gate electrode of the first-second transistor ST1-2 can be stably maintained. Therefore, the leakage current flowing through the pixel circuit can be reduced to improve the image quality of the display device, and the luminance drops of the pixels can be suppressed to prevent or reduce instances of a flicker.

Figure 9:
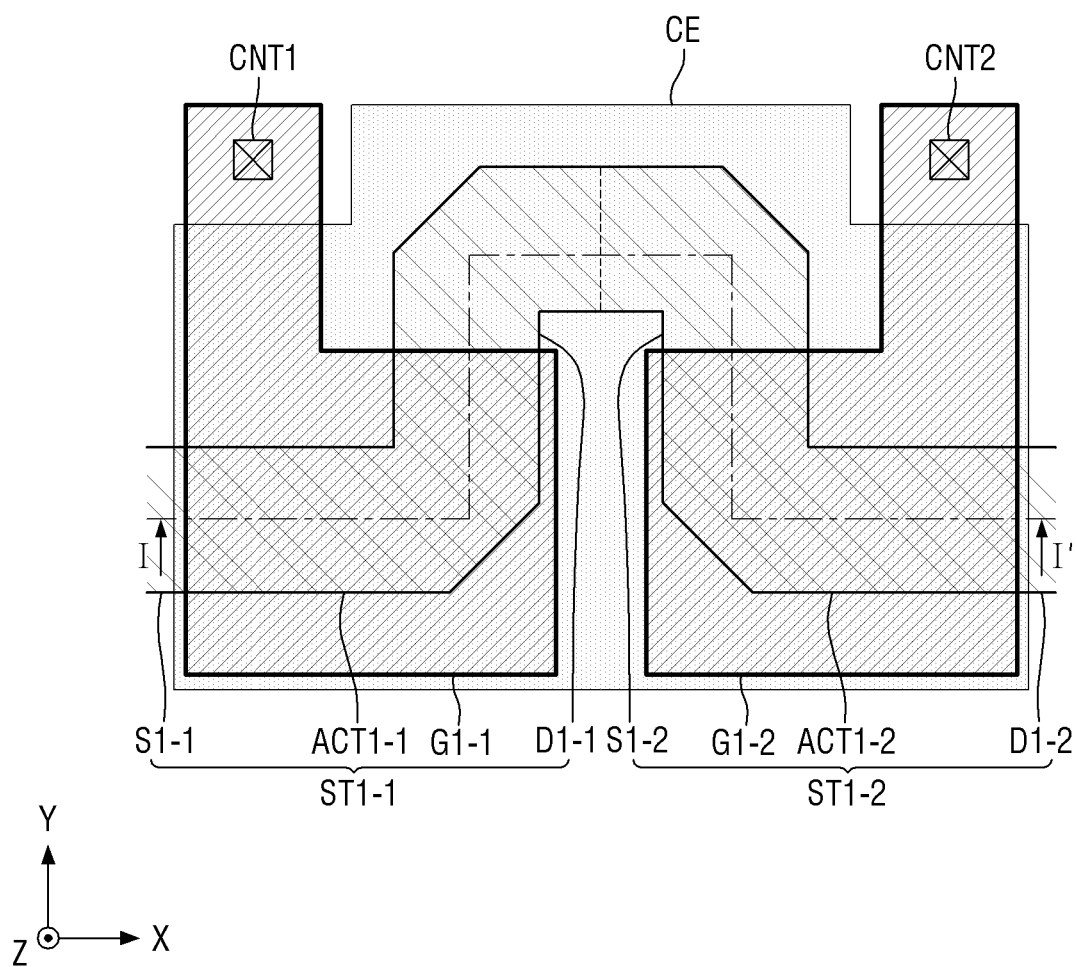
FIG. 9 is a plan view illustrating a first-first transistor and a first-second transistor of a display device according to some example embodiments.
Figure 10:
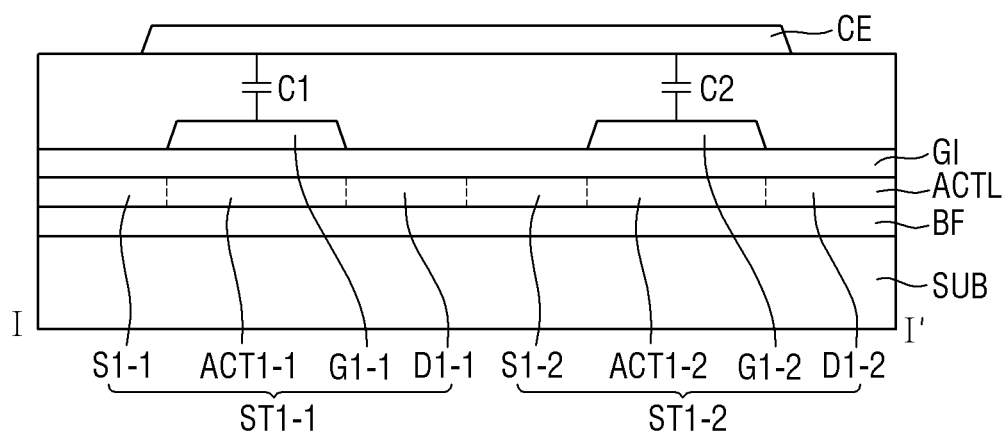
FIG. 10 is a cross-sectional view taken along the line I-I' of FIG. 9 according to some example embodiments.

FIG. 9 is a plan view illustrating a first-first transistor and a first-second transistor of a display device according to some example embodiments. FIG. 10 is a cross-sectional view taken along the line I-I' of FIG. 9.

Referring to FIGS. 9 and 10, the first-first transistor ST1-1 may include a first electrode S1-1, an active area ACT1-1, a second electrode D1-1, and a gate electrode G1-1.

The first electrode S1-1 of the first-first transistor ST1-1 may extend in the first direction (X-axis direction). One end of the active area ACT1-1 of the first-first transistor ST1-1 may be connected to the first electrode S1-1, and the other end of the active area ACT1-1 thereof may be bent in the second direction (Y-axis direction) intersecting the first direction (X-axis direction). One end of the second electrode D1-1 of the first-first transistor ST1-1 may be connected to the active area ACT1-1, and the other end of the second electrode D1-1 thereof may be bent in the first direction (X-axis direction).

The gate electrode G1-1 of the first-first transistor ST1-1 may be located or arranged on the active area ACT1-1 to overlap the active area ACT1-1 in the thickness direction. The gate electrode G1-1 of the first-first transistor ST1-1 may not overlap the second electrode D1-1 of the first-first transistor ST1-1 or a first electrode S1-2 of the first-second transistor ST1-2. A part of the gate electrode G1-1 of the first-first transistor ST1-1 may protrude not to overlap a capacitor electrode CE, and to be connected to a first connection electrode through a first contact hole CNT1. The gate electrode G1-1 of the first-first transistor ST1-1 may be connected to the first node N1 through the first connection electrode.

The first-second transistor ST1-2 may include a first electrode S1-2, an active area ACT1-2, a second electrode D1-2, and a gate electrode G1-2.

One end of the first electrode S1-2 of the first-second transistor ST1-2 may be connected to the second electrode D1-1 of the first-first transistor ST1-1, and the other end of the first electrode S1-2 thereof may be bent in the second direction (Y-axis direction). One end of the active area ACT1-2 of the first-second transistor ST1-2 may be connected to the first electrode S1-2, and the other end of the active area ACT1-2 thereof may be bent in the first direction (X-axis direction). The second electrode D1-2 of the first-second transistor ST1-2 may be connected to the active area ACT1-2 to extend in the first direction (X-axis direction).

The gate electrode G1-2 of the first-second transistor ST1-2 may be located or arranged on the active area ACT1-2 to overlap the active area ACT1-2 in the thickness direction. The gate electrode G1-2 of the first-second transistor ST1-2 may not overlap the second electrode D1-1 of the first-first transistor ST1-1 or the first electrode S1-2 of the first-second transistor ST1-2. A part of the gate electrode G1-2 of the first-second transistor ST1-2 may protrude not to overlap the capacitor electrode CE, and to be connected to a second connection electrode through a second contact hole CNT2. The gate electrode G1-2 of the first-second transistor ST1-2 may be connected to the second node N2 through the second connection electrode.

Referring to FIG. 10 in conjunction with FIG. 9, the display panel 300 may include a substrate SUB, a buffer layer BF, an active layer ACTL, a gate insulating layer GI, a first gate layer GTL1, and an interlayer insulating layer ILD and a second gate layer GTL2.

The substrate SUB may be a base substrate, and may be made of an insulating material such as polymer resin. For example, the substrate SUB may be a flexible substrate which can be bent, folded and rolled.

The buffer layer BF may be located or arranged on the substrate SUB. For example, the buffer layer BF may include a plurality of inorganic films and may be formed entirely on the upper surface of the substrate SUB to block moisture from entering the light emitting element EL through the substrate SUB.

The active layer ACTL may be located or arranged on the buffer layer BF. The active layer ACTL may be made of a silicon-based material. For example, the active layer ACTL may be formed of low temperature polycrystalline silicon (LTPS). The first electrode S1-1, the active area ACT1-1, and the second electrode D1-1 of the first-first transistor ST1-1 and the first electrode S1-2, the active area ACT1-2, and the second electrode D1-2 of the first-second transistor ST1-2 may be located or arranged in the active layer ACTL.

The gate insulating layer GI may cover the active layer ACTL to insulate the active layer ACTL from the first gate layer GTL1.

The first gate layer GTL1 may be located or arranged on the gate insulating layer GI. The gate electrode G1-1 of the first-first transistor ST1-1 and the gate electrode G1-2 of the first-second transistor ST1-2 may be located or arranged in the first gate layer GTL1.

A part of the gate electrode G1-1 of the first-first transistor ST1-1 may overlap the capacitor electrode CE to form the first electrode of the first capacitor C1. A part of the gate electrode G1-2 of the first-second transistor ST1-2 may overlap the capacitor electrode CE to form the first electrode of the second capacitor C2.

The interlayer insulating layer ILD may cover the first gate layer GTL1 and the gate insulating layer GI. The interlayer insulating layer ILD may insulate the first gate layer GTL1 from the second gate layer GTL2.

The second gate layer GTL2 may be located or arranged on the interlayer insulating layer ILD. The capacitor electrode CE may be located or arranged in the second gate layer GTL2.

A part of the capacitor electrode CE may overlap the gate electrode G1-1 of the first-first transistor ST1-1 to form the second electrode of the first capacitor C1. Another part of the capacitor electrode CE may overlap the gate electrode G1-2 of the first-second transistor ST1-2 to form the second electrode of the second capacitor C2. The capacitor electrode CE may be connected to the driving voltage line VDDL to receive the driving voltage VDD.

Through the manufacturing process of the display device 10, the display device 10 includes the second electrode D1-1 of the first-first transistor ST1-1 and the first electrode S1-2 of the first-second transistor ST1-2 arranged between the gate electrode G1-1 of the first-first transistor ST1-1 and the gate electrode G1-2 of the first-second transistor ST1-2, so that hydrogen of the active layer ACTL can be released to the interlayer insulating layer ILD. Accordingly, it may be possible to reduce the sensitivity of the first-first transistor ST1-1 and the first-second transistor ST1-2. Therefore, in the display device 10, the driving ranges of the first-first transistor ST1-1 and the first-second transistor ST1-2 can be increased, thereby precisely controlling the gradation of light emitted from the light emitting element EL.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:
1. A display device comprising:
a plurality of pixels on a substrate, each of the plurality of pixels including a light emitting element and a pixel circuit configured to drive the light emitting element,
wherein the pixel circuit of each of the plurality of pixels comprises:

a first-first transistor configured to control a driving current flowing through the light emitting element based on a voltage of a first node;
a first-second transistor connected in series with the first-first transistor and configured to control the driving current based on a voltage of a second node, wherein the first-first transistor and the first-second transistor are connected in series between a third node and a fourth node;
a second transistor configured to selectively supply a data voltage to the third node which is a first electrode of the first-first transistor;
a third-first transistor connected between the first node and the fourth node which is a second electrode of the first-second transistor, the third-first transistor being directly connected to the fourth node; and
a third-second transistor connected between the second node and the fourth node, the third-second transistor being directly connected to the fourth node.

2. The display device of claim 1, wherein the second transistor, the third-first transistor, and the third-second transistor are configured to be turned on based on a first gate signal received from a first gate line.

3. The display device of claim 1, wherein the pixel circuit further comprises:
a first capacitor connected between the first node and a driving voltage line; and
a second capacitor connected between the second node and the driving voltage line.

4. The display device of claim 3, wherein the first-first transistor includes:
a first electrode extending in a first direction;
an active area connected to the first electrode and configured to be bent in a second direction crossing the first direction;
a second electrode connected to the active area and configured to be bent in the first direction; and
a gate electrode on the active area and overlapping the active area in a thickness direction.

5. The display device of claim 4, wherein the first-second transistor includes:
a first electrode connected to the second electrode of the first-first transistor and configured to be bent in the second direction;
an active area connected to the first electrode and configured to be bent in the first direction;
a second electrode connected to the active area and extending in the first direction; and
a gate electrode on the active area and overlapping the active area in a thickness direction.

6. The display device of claim 5, wherein the pixel circuit further comprises a capacitor electrode on the gate electrode of the first-first transistor and the gate electrode of the first-second transistor, and
the first capacitor is formed between the gate electrode of the first-first transistor and the capacitor electrode, and the second capacitor is formed between the gate electrode of the first-second transistor and the capacitor electrode.

7. The display device of claim 1, wherein the pixel circuit further comprises:
a fourth-first transistor connected between the first node and an initialization voltage line; and
a fourth-second transistor connected between the first node and the second node.

8. The display device of claim 7, wherein the fourth-first transistor and the fourth-second transistor are configured to be turned on based on a second gate signal received from a second gate line.

9. The display device of claim 7, wherein the pixel circuit further comprises:
a fifth transistor connected between the third node and a driving voltage line; and
a sixth transistor connected between the fourth node and a fifth node which is a first electrode of the light emitting element.

10. The display device of claim 9, wherein the fifth transistor and the sixth transistor are configured to be turned on based on an emission signal received from an emission control line.

11. The display device of claim 9, wherein the pixel circuit further comprises a seventh transistor connected between the initialization voltage line and the fifth node.

12. The display device of claim 11, wherein the seventh transistor is configured to be turned on based on a third gate signal received from a third gate line.

13. A display device comprising:
a plurality of pixels on a substrate, each of the plurality of pixels including a light emitting element and a pixel circuit configured to drive the light emitting element,
wherein the pixel circuit of each of the plurality of pixels comprises:
a first-first transistor configured to control a driving current flowing through the light emitting element based on a voltage of a first node;
a first-second transistor connected in series with the first-first transistor and configured to control the driving current based on a voltage of a second node;
a first capacitor connected between the first node and a driving voltage line;
a second capacitor connected between the second node and the driving voltage line;
a second transistor configured to selectively supply a data voltage to a third node which is a first electrode of the first-first transistor;
a third-first transistor connected between the first node and a fourth node which is a second electrode of the first-second transistor;
a third-second transistor connected between the second node and the fourth node;
a fourth-first transistor connected between the first node and an initialization voltage line; and
a fourth-second transistor connected between the first node and the second node.

14. The display device of claim 13, wherein the second transistor, the third-first transistor, and the third-second transistor are configured to be turned on based on a first gate signal received from a first gate line.

15. The display device of claim 13, wherein the fourth-first transistor and the fourth-second transistor are configured to be turned on based on a second gate signal received from a second gate line.

16. The display device of claim 13, wherein the pixel circuit further comprises:
a fifth transistor connected between the third node and the driving voltage line; and
a sixth transistor connected between the fourth node and a fifth node which is a first electrode of the light emitting element.

17. The display device of claim 16, wherein the fifth transistor and the sixth transistor are configured to be turned on based on an emission signal received from an emission control line.

18. The display device of claim 16, wherein the pixel circuit further comprises a seventh transistor connected between the initialization voltage line and the fifth node.

19. The display device of claim 18, wherein the seventh transistor is configured to be turned on based on a third gate signal received from a third gate line.

* * * * *